(12) United States Patent
Van Wijck

(10) Patent No.: US 6,592,942 B1
(45) Date of Patent: Jul. 15, 2003

(54) METHOD FOR VAPOUR DEPOSITION OF A FILM ONTO A SUBSTRATE

(75) Inventor: Margreet Albertine Anne-Marie Van Wijck, Oldebroek (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/611,602

(22) Filed: Jul. 7, 2000

(51) Int. Cl.[7] .................. C23C 16/40; C23C 16/44; C23C 16/455; C23C 23/06
(52) U.S. Cl. .................. 427/255.34; 427/255.23; 427/255.28; 427/255.31; 427/255.36; 427/255.7; 117/88; 117/104; 117/105
(58) Field of Search .................. 118/715; 427/248.1, 427/255.15, 255.7, 255.23, 255.28, 255.31, 255.34, 255.36, 255.391, 255.394; 117/84, 88, 104, 105

(56) References Cited

U.S. PATENT DOCUMENTS

| | | | | | |
|---|---|---|---|---|---|
| 4,058,430 A | * | 11/1977 | Suntola et al. | ......... | 427/255.13 |
| 4,420,385 A | * | 12/1983 | Hartsough | ............ | 204/192.23 |
| 4,560,590 A | | 12/1985 | Bok | | |
| 4,798,165 A | | 1/1989 | deBoer et al. | | |
| 4,840,921 A | * | 6/1989 | Matsumoto | ................... | 437/89 |
| 4,931,132 A | * | 6/1990 | Aspnes et al. | .............. | 156/601 |
| 5,166,092 A | * | 11/1992 | Mochizuki et al. | ......... | 437/105 |
| 5,374,570 A | * | 12/1994 | Nasu et al. | ................... | 437/40 |
| 5,420,072 A | * | 5/1995 | Fiordalice et al. | ......... | 437/192 |
| 5,443,647 A | * | 8/1995 | Aucoin et al. | .............. | 118/723 |
| 5,711,811 A | | 1/1998 | Suntola et al. | | |
| 5,772,770 A | | 6/1998 | Suda et al. | | |
| 5,788,425 A | | 8/1998 | Skow et al. | | |
| 5,841,490 A | * | 11/1998 | Matsuo | ........................ | 349/40 |
| 5,851,849 A | * | 12/1998 | Comizzoli et al. | ............ | 372/49 |
| 5,879,459 A | * | 3/1999 | Gadgil et al. | ............... | 118/715 |
| 5,905,548 A | * | 5/1999 | Shimada | ...................... | 349/38 |
| 5,998,236 A | * | 12/1999 | Roeder et al. | .............. | 438/104 |
| 6,008,083 A | * | 12/1999 | Brabazon et al. | ........... | 438/239 |
| 6,124,158 A | * | 9/2000 | Dautartas et al. | ........... | 438/216 |
| 6,144,060 A | * | 11/2000 | Park et al. | ................... | 257/298 |
| 6,358,829 B2 | * | 3/2002 | Yoon et al. | .................. | 438/597 |

FOREIGN PATENT DOCUMENTS

| | | |
|---|---|---|
| EP | 0 308 946 A2 | 3/1989 |
| EP | 340113 A1 * | 11/1989 |
| EP | 1 167 567 A1 | 1/2002 |
| WO | WO 96/17969 | 6/1996 |
| WO | WO 96/17973 | 6/1996 |
| WO | WO 98/01890 | 1/1998 |
| WO | WO 99/28527 | 6/1999 |

OTHER PUBLICATIONS

Ritala et al. "Effects of intermediate zinc pulse on properties of TiN and NbN films deposited by atomic layer epitaxy" Applied Surface Science, vol. 120, p. 199–212, Elsevier Science B.V., Jul. 22, 1997.*

Kukli et al. "In situ study of atomic layer epitaxy growth of tantalum oxide thin films from Ta(OC2H5)5 and H2O" Applied Surface Science, vol. 112, pp. 236–242, Elsevier Science B.V., 1997.*

Ritala and Leskela, "Zirconium dioxide thin films deposited by ALE using zirconium tetrachloride as a precursor" Applied Surface Science, p. 1–8, Elsevier Science B.V., Jun. 23, 1993.*

* cited by examiner

Primary Examiner—Shrive P. Beck
Assistant Examiner—Wesley D. Markham
(74) Attorney, Agent, or Firm—Knobbe, Martens, Olson & Bear, LLP

(57) ABSTRACT

Method for chemical vapor deposition of a film onto a substrate. Before bulk chemical vapor deposition the substrate is subjected to a nucleation treatment. The nucleation treatment comprises atomic layer deposition wherein the substrate is alternatingly and sequentially exposed to pulses of at least two mutually reactive gaseous reactants wherein the nucleation temperature is chosen to prevent condensation of either of the used reactants and to prevent substantial thermal decomposition of each of the reactants individually.

9 Claims, 4 Drawing Sheets

METHOD FOR VAPOUR DEPOSITION OF A FILM ONTO A SUBSTRATE

FIELD OF THE INVENTION

The present invention relates to a method for the deposition of a thin film onto a substrate by the technique of chemical vapor deposition and in particular to a deposition process wherein the conditions during a first nucleation stage differ from the conditions during a second deposition stage for the bulk deposition of the film by means of chemical vapour deposition.

BACKGROUND OF THE INVENTION

Such a process is known from WO 99/28527 from Applied Materials Inc. This document describes the chemical vapour deposition of a tungsten layer, using SiH4 and WF6, comprising a first deposition stage to facilitate nucleation of the film, followed by a second deposition stage. The technique of chemical vapor deposition to deposit solid thin films on substrates using one or more gaseous reactants has been known for many years. After inserting the substrate into a reaction chamber and closing the reaction chamber the chamber is evacuated. The substrate is heated to a temperature required for the reaction to proceed at an economical rate and the gaseous reactant or reactants are introduced into the reaction chamber. During the process the conditions like temperature, reactant flows and pressure are typically maintained at a constant value. The reactants or reactive species adsorb on the surface of the substrate and decompose or react with each other under the formation of a solid film and the release of gaseous by-products. One of the problems encountered in the chemical vapor deposition technique is that many processes are afflicted with a nucleation process which depends on the condition of the underlying surface. This means that the tendency of the reactants to adsorb on the surface, decompose and form a solid film depends on the condition of the surface of the substrate. In some cases this can be advantageously applied, e.g. in selective processes where the deposition of a film over exposed silicon surfaces is desired but not over parts of the substrate surface which are covered with silicon oxide. In order to achieve this result, the conditions can be chosen such that the nucleation rate on silicon is orders of magnitude higher than the nucleation rate on silicon oxide. After the surface is covered with a thin film of the material, the further deposition typically proceeds at a faster rate. In many cases, however, this phenomena leads to undesired effects, e.g. when a uniform deposition over all parts of the surface is desired.

In the prior art the problems related to a surface dependent nucleation are overcome by introducing a first deposition stage in the chemical vapour deposition process with process conditions that are favourable for nucleation of the film to be deposited and which are different from the conditions in the second and main deposition stage where the remainder of the film is to be deposited. However, conditions favorable for rapid nucleation are not necessarily favorable for uniform nucleation and/or deposition over the entire wafer surface as well as in trenches in the wafer surface.

Furthermore, the nucleation rate on parts of the reaction chamber can be different from the nucleation rule on the substrate. As a consequence, the nucleation stage on some inner surfaces in the reactor can be completed earlier th on other surfaces. When the nucleation stage is completed, film deposition starts, which leads to a higher consumption of the reactants. This means that the local conditions in the reaction chamber change in the course of the time during the nucleation phase which influences the controllability of the process in a negative way. For example, a linear extrapolation of the film thickness with the deposition time will give an unreliable prediction of the actual film thickness achieved. In addition, in the case of a batch reactor, not all wafers face a same local environment. In many cases the substrates have a wafer-like shape i.e. are thin in one dimension and much larger in the two other dimensions and in a batch reactor they are placed in a row, with their large surfaces normal to the direction of the row and at some mutual distance. In this case most of the substrates face other substrates to be processed. However, the first and the last wafer face an other local environment which can result in a significantly different film thickness on the substrate at the end of the deposition process. Also the presence of test wafers within a batch of product wafers results in a locally different environment.

Another problem related to the nucleation stage of the process is surface roughness. When nuclei are formed, they grow out in both horizontal and vertical directions till the complete surface area is covered. This process results in a relief of the surface. When the density of nuclei is high the relief is small and when the density of nuclei is low, the relief is pronounced. This relief will typically remain when the growth proceeds.

It is the object of the present invention to provide in a method of in-situ pre-treatment prior to the execution of the chemical vapor deposition process that avoids these disadvantages and produces a homogeneous starting surface for all surface areas within the reaction chamber.

SUMMARY OF THE INVENTION

The present invention proposes to perform the nucleation in the first stage of the process by Atomic Layer Deposition. According to one aspect of the invention a method is provided for chemical vapor deposition of a film onto a substrate comprising:

inserting a substrate in a reaction chamber, subjecting said substrate to a first treatment comprising a nucleation treatment at a first temperature, followed by a second treatment comprising bulk chemical vapor deposition at a second temperature wherein, said nucleation treatment comprises atomic layer deposition, wherein the substrate is alternatingly and sequentially exposed to pulses of at least two manually reactive gaseous reactants, said first temperature being chosen to prevent condensation of either of said reactants and to prevent substantial thermal decomposition of each of said reactants individually.

In the method according to the invention, a substrate or a plurality of substrates is inserted into the reaction chamber, the reaction chamber is closed and evacuated and the substrate is heated to a first temperature. At this first temperature at least two reactants are alternately and sequentially introduced into the reaction chamber. This first temperature is high enough to prevent condensation of the reactants on the substrate surface but so low that no thermal decomposition of the individual reactants occurs. Consequently, during the supply of the first reactant only a monolayer of the reactant chemisorps on the surface and then the surface is saturated. When the second reactant is supplied it chemisorps on the surface, reacts with the previous reactant and forms a solid monolayer until the surface is fully saturated. This cycle can be repeated a number of times. This method is called Atomic Layer Deposition and is much less susceptible for surface influence than normal chemical vapor deposition. Each reaction is self-limiting. It is possible to carry out this method with more than 2 reactants, e.g. 3 reactants for the deposition of a ternary compound, provided that the reactants are matching and, when introduced into the reactor separately, do not thermally decompose at the first temperature. Due to the deposition of a thin film by Atomic Layer Deposition, a uniform starting surface is provided for the subsequent chemical vapor deposition on all surfaces in the reaction chamber. After the Atomic Layer Deposition pre-treatment, the substrate is heated to a second temperature and the reactants for the chemical vapor deposition process are introduced into the reactor. After completion of the deposition by chemical vapor deposition the supply of reactants is cut-off and after evacuating and/or purging the reaction chamber and back-filling it to atmospheric pressure, when required, the substrate is removed from the reaction chamber.

In a first embodiment the thin film deposited by the Atomic Layer Deposition pre-treatment has mainly the same composition as the film deposited by chemical vapor deposition. In a second embodiment the thin film deposited by the Atomic Layer Deposition pretreatment has a different composition than the film deposited in the chemical vapor deposition step. In the case of layers, deposited in the two deposition stages, with substantially the same composition, the first temperature at which the Atomic Layer Deposition is carried out is typically lower than the second temperature at which the chemical vapor deposition is carried out, but this depends also on the reactants chosen.

In Atomic Layer Deposition processes the deposition rate is very low because of the required purge times in between the respective reactant pulses. Therefore, the reactor volume and shape of an Atomic Layer Deposition reactor is optimized to yield minimum purge times and a maximum deposition rate. Inherently to the Atomic Layer Deposition process is at the process conditions like pressure, temperature and flow are not critical as long as sufficient reactant is supplied. Because the process is based on the sequential and alternating saturation of the surface with one monolayer of reactant, a uniform film deposition will be obtained whenever saturation of the surface is achieved in the repeated cycles. On the other hand, reactors for regular chemical vapour deposition are optimized for uniform film deposition at an economical deposition rate. In chemical vapour deposition, temperature, pressure and reactant flow are critical parameters and the design of the reactor takes this into account to achieve a uniform deposition. This reactor design is not optimum for economical Atomic Layer Deposition. However, when Atomic Layer Deposition is applied as an in-situ pre-conditioning prior to chemical vapour deposition in a reactor designed for regular chemical vapour deposition, a limited number of Atomic Layer Deposition cycles with a time duration that is not economical for Atomic Layer Deposition are allowable to yield an overall process that is still economical. One of the measures taken to reduce the cycle time of the Atomic Layer Deposition pulses is to maintain the pressure inside the reaction chamber at a low value to allow rapid purging of the reaction chamber volume in between the pulses. Preferably this pressure is maintained below 10 Torr and more preferably this value is maintained below 1 Torr.

The method of Atomic Layer Deposition results in a full coverage of the substrate surface and a layer by layer growth. Therefore the surface roughness which is a result of a nucleation stage is omitted and the surface after Atomic Layer Deposition is basically just as smooth as the starting surface.

DETAILED DESCRIPTION OF THE INVENTION

Figure 1:
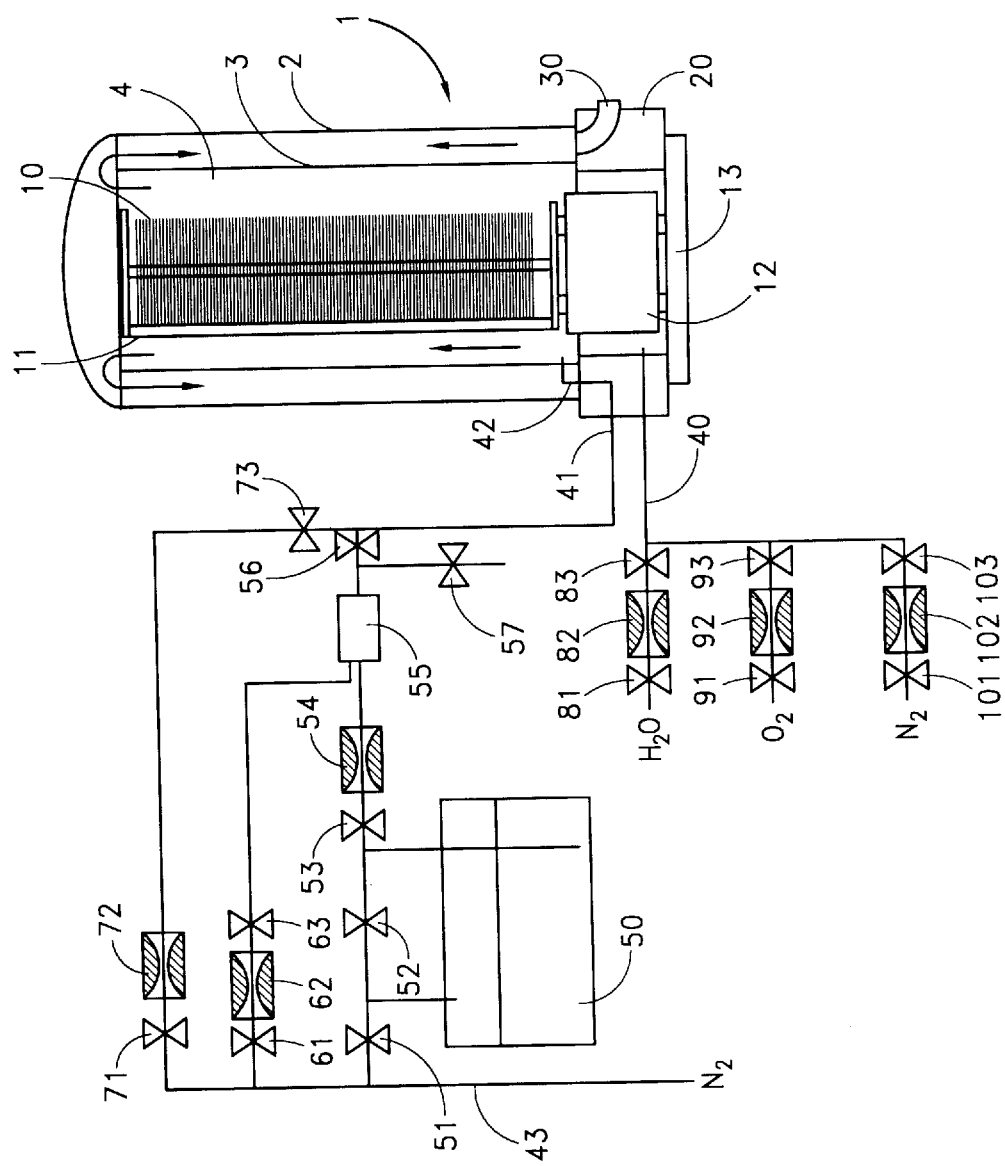
FIG. 1 Schematical presentation of gas system and furnace.

FIG. 1 gives a schematical presentation of a gas system and furnace utilized for an embodiment of the method according to the invention for the purpose of tantalum oxide deposition. The furnace in its entirety is indicated by 1, the process tube 2 and an inner liner by 3 which inner liner delimits a reaction chamber 4. The process tube is surrounded by a heating element, not shown. A plurality of wafer like substrates 10 is placed in a holder 11 which holder is supported by a pedestal 12. The pedestal is supported by a doorplate 13 which closes the reaction chamber 4. The process tube 2 and inner liner 3 are supported by a flange 20. Gas is injected into the process chamber 4 by the gas supply lines 40 and 41, either directly or via a gas injector 42. The gas is exhausted via the gap between inner liner and process tube, through the gas exhaust line 30 towards the pump (not shown). The container with tantalum penta ethoxide 50 is connected to a nitrogen supply line 43 to be able to put the liquid source material under pressure. The flow of liquid source material is measured by liquid flow meter 54. In vaporizer unit 55 the flow of liquid source material is controlled, mixed with nitrogen and vaporized. The vaporized flow is fed into the gas supply line 41 by opening valve 56. Alternatively, before and after feeding the vaporized flow into the reactor, the flow can be directed towards the pump (not shown) by opening valve 57 while valve 56 is closed. The flow of nitrogen to the vaporizer is controlled by Mass Flow Controller 62 whereas Mass Flow Controller 72 controls a flow of nitrogen directly fed into the gas supply line 41. Mass flow controllers 82, 92 and 102 control the flows of respectively H2O, O2 and N2, fed into the reactor via gas supply line 40. Pneumatically operated shut-off valves 61, 71, 81, 91 and 101 provide in means to isolate the respective mass flow controllers front the gas supply lines at the upstream side and pneumatically operated valves 63, 73, 83, 93 and 103 provide in means to isolate the mass flow controllers at the downstream side. Shut-off valve 51 can isolate the tantalum penta ethoxide container 50 from the nitrogen supply line 43. Closing shut-off valve 53 interrupts the liquid tantalum penta ethoxide flow and opening valve 52 allows purging of the liquid flow controller 54 by $N_2$.

Figure 2:
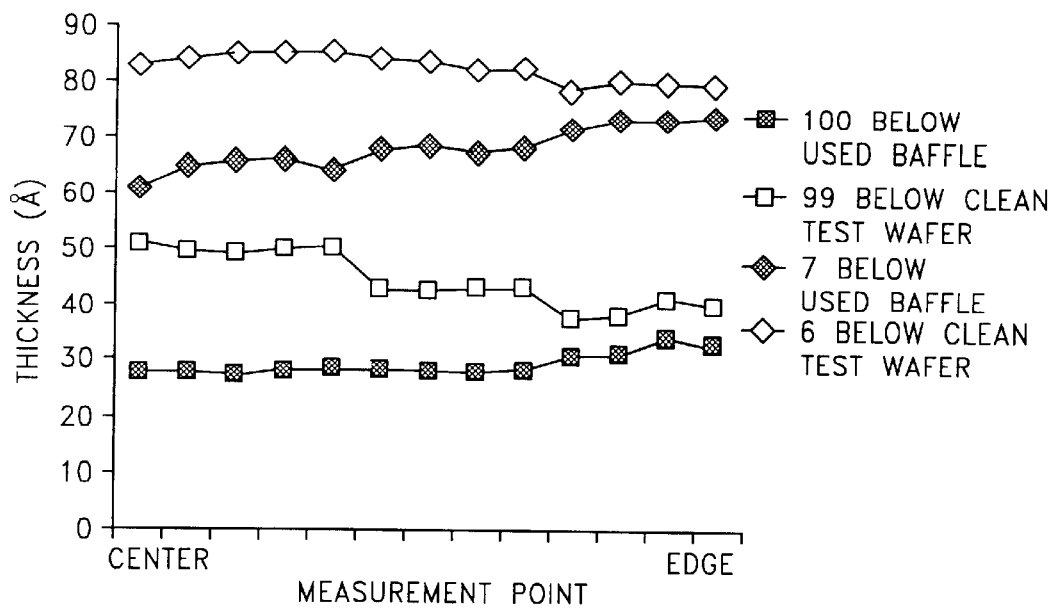
FIG. 2 Thickness results with an LPCVD process in accordance to the prior art, different types of substrates present.

In FIG. 2, the thickness results for a tantalum oxide chemical vapor deposition process are given for a process according to the prior art. In the specific example, the processing was carried out in the batch reactor, schematically represented in FIG. 1, with a batch size of 110 substrates. The gas is inserted from the side where wafer 1 is located and the gas is exhausted at the side where wafer 110 is located. In a reactor filled with 110 filler wafers containing a deposition of tantalum oxide, four filler wafers, at positions or slots 6, 7, 99 and 100 were replaced by bare silicon test wafers. Consequently, two bare silicon test wafers, namely 6 and 99, were facing with their front side respectively the bare silicon test wafer 7 and 100 whereas wafer 7 and 100 were facing a filler wafer covered with tantalum oxide. After deposition the film thickness of the tantalum oxide film was measured by an ellipsometer at thirteen points on the wafer, from the centre of the wafer to the edge of the wafer. It appears that the film thickness on the wafers facing a bare silicon test wafer is larger than on the wafers facing a filler wafer covered with tantalum oxide. This effect is most pronounced in the centre region of the wafer. It should be noted that in addition to this effect there is difference in thickness between on the one hand wafers 6 and 7 and on the other hand wafers 99 and 100. This "down load" difference is caused by depletion effects over the wafer load and is due to the fact that the process has not been fully optimized yet.

Figure 3:
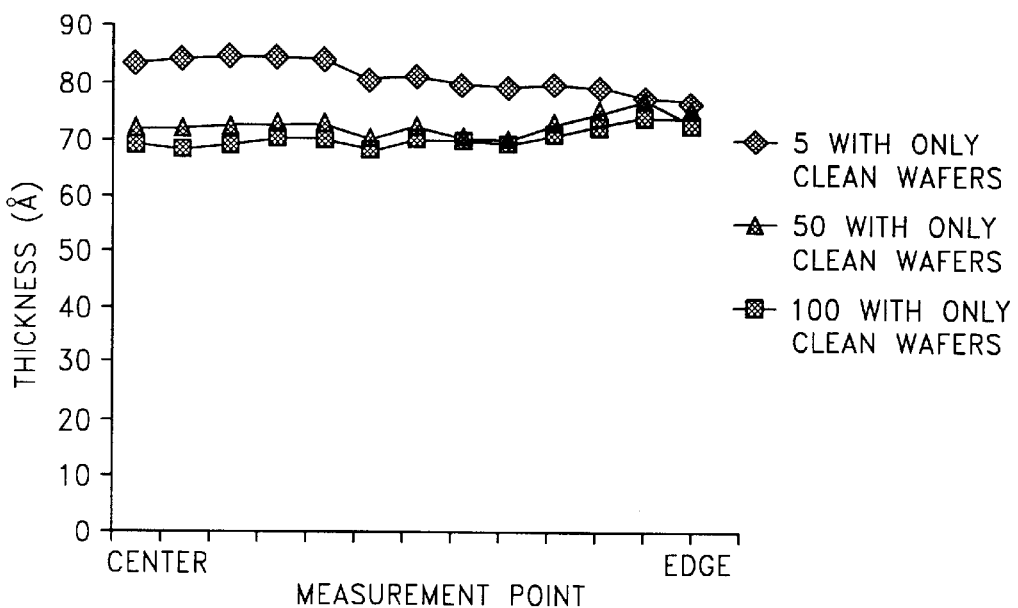
FIG. 3 Thickness results with an LPCVD process in accordance to the prior art, all substrates present are bare silicon substrates.

In FIG. 3 it is shown that not only the surface condition of the wafer facing the test wafers is important but that the surface condition of all the test wafers has an influence on the overall result. In FIG. 3 all the filler wafers were replaced by clean, bare silicon filler wafers. The deposition rate is much more homogeneous over the whole batch. Apparently, on a bare silicon wafer the tantalum oxide deposition process is subjected to a nucleation phase whereas on a tantalum oxide surface the deposition can start immediately. Therefore, the tantalum oxide surfaces result in more depletion effects and thinner films on the bare silicon test wafers.

Figure 4:
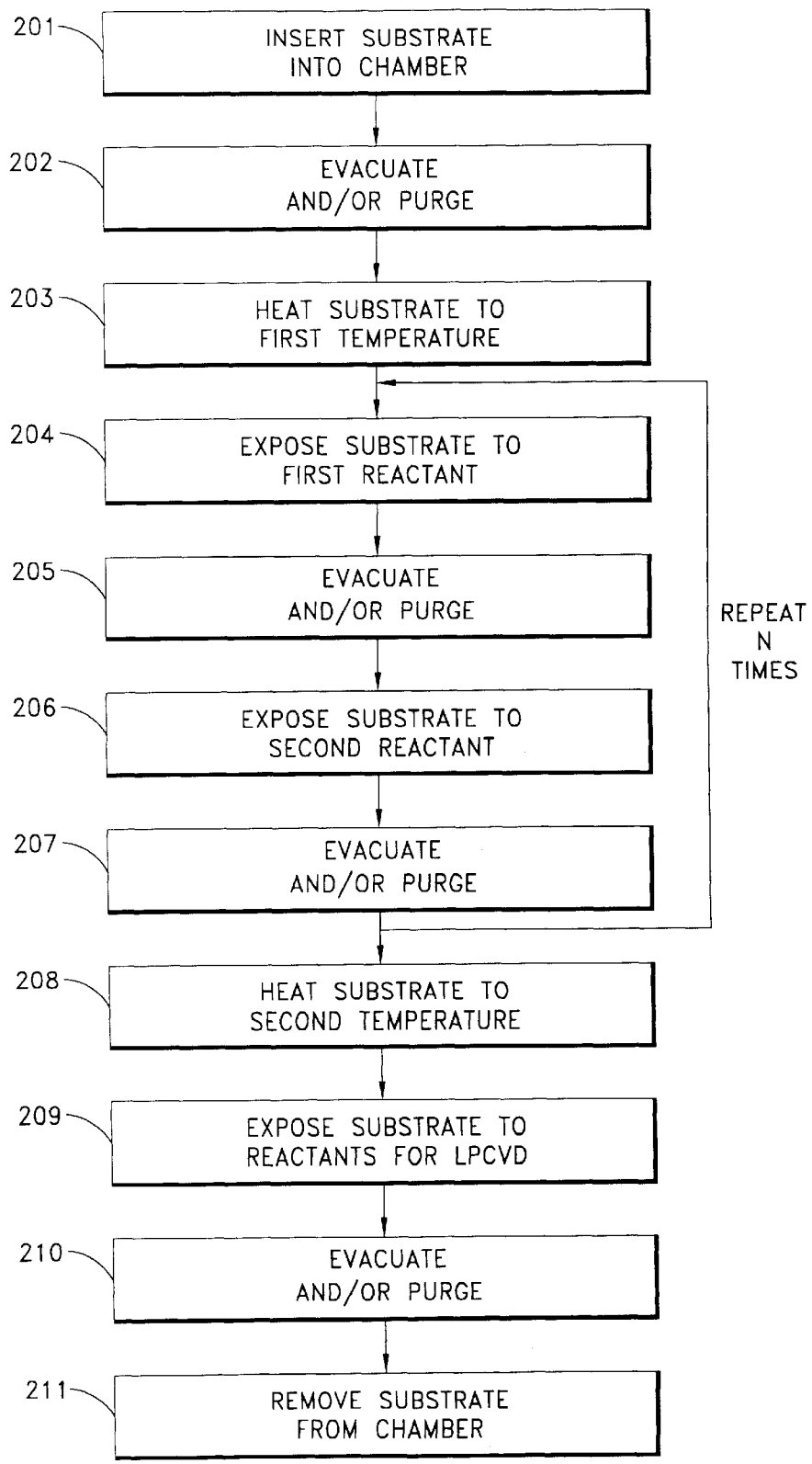
FIG. 4 A flow diagram of the process according to the invention.

In FIG. 4 a flow diagram of a process in accordance to the invention is given. The first step is to insert 201 a substrate, or in case of a batch reactor a plurality of substrates into the reaction chamber. Then the reaction chamber is evacuated and/or purged 202 to remove impurities from the reaction chamber. Indicated with numeral 203 is that the substrate (or plurality of substrates) is heated to a first temperature. In steps 204–207 an example of an Atomic Layer Deposition cycle employing two reactants is given. Between the exposure steps of the respective reactants, the reaction chamber is evacuated and/or purged to keep the two reactants well separated. The cycle can be repeated as often as required to achieve the desired homogeneous surface conditioning over all the surface areas inside the reaction chamber. A minimum number of cycles should be one. After completion of the Atomic Layer Deposition cycles, the substrate is heated to a second temperature as indicated by numeral 208. Subsequently, the substrate is exposed to the reactant or reactants used for the LPCVD process as indicated by reference numeral 209. In step number 210 the reactants and reaction products are removed from the reaction chamber by evacuation and/or purging. In the last step 211 the substrate is removed from the reaction chamber.

Figure 5:
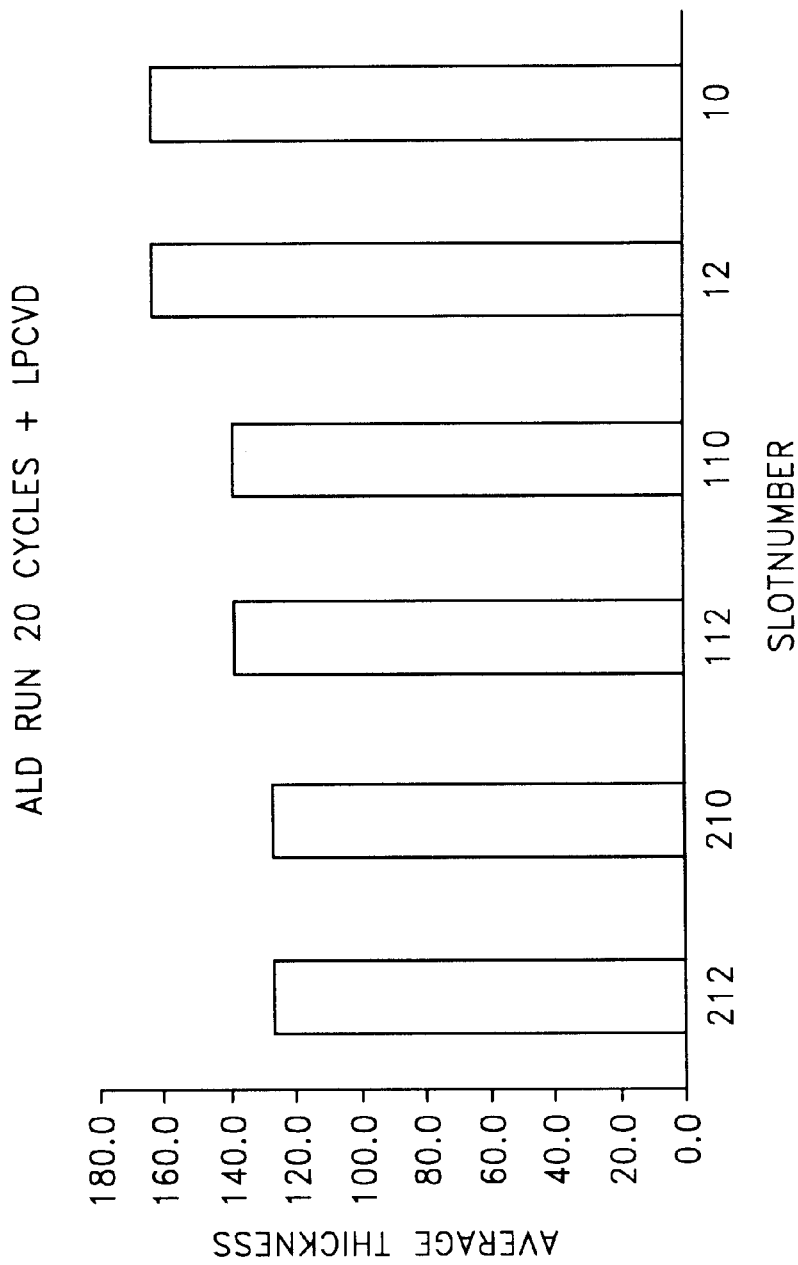
FIG. 5 Thickness results from the process according to the invention.

In FIG. 5, the results of a process in accordance to the invention and to example 1 is given.

EXAMPLE 1

A specific example of a process in accordance with the invention is the following. After inserting a plurality of substrates into a hot wall batch reactor, the substrates are heated to 220° C. As a first reactant, tantalum pentaethoxide (TAETO,=Ta—(O—C2H5)5) mixed with nitrogen is admitted into the reactor while pumping at the exhaust end of the reactor and maintaining a pressure of 1 Torr. The temperature of the vessel containing the (TAETO) is maintained at 35° C. A nitrogen pressure is applied to the vessel and a flow of liquid TAETO, corresponding to a vapor flow of 9 sccn, is fed from the vessel into an evaporator. A flow of nitrogen of 500 sccm is also fed into the evaporator. TAETO vapour, together with the nitrogen gas flow is fed from the evaporator into the reactor. The duration of the TAETO exposure is 2 min. After cut-off of the TAETO supply the reactor is purged for 2 minutes with approximately 500 sccm N2, the N2 flow is interrupted for 30 seconds while the evacuation is continued and the N2 flow is switched on again for 2 minutes. Then a flow of water vapor of 500 sccm is supplied to the reactor during 2 minutes, followed by a purge/evacuate/purge sequence. This whole cycle was repeated 20 times. After these Atomic Layer Deposition cycles the substrates were heated to 400° C. and the LPCVD process was executed with the following conditions: 250 or 375 mTorr, 9 sccm TAETO vapor, 200 sccm O2, 550 sscm N2.

In a second example, tantalum tetraethoxide dimethylaminoethoxide [Ta(OC2H5)4OCH2CH2N(CH3)2] is utilized as the source material for tantalum oxide deposition.

Although in example 1 a hot wall batch furnace is utilized, a person skilled in the art will understand that the method of the invention will apply to any batch, single wafer, hot wall or cold wall CVD reactor according to the state of the art. In another example, the nucleation treatment comprises the Atmomic Layer Deposition of an alumina or zirconia layer. In yet another example the bulk chemical vapor deposition comprises the deposition of a TiN layer, preferably preceded by a zirconia nucleation step.

A person skilled in the art will immediately realise that in the above only preferred examples of the embodiment are given. The scope of protection is only limited by the appended claims.

What is claimed is:

1. A method for chemical vapor deposition of material onto a substrate comprising:

inserting a substrate in a reaction chamber;

subjecting said substrate to a first treatment at a first temperature within the reaction chamber, the first treatment comprising atomic layer deposition for a nucleation treatment of the substrate at a first temperature to deposit a metal oxide nucleation film on the substrate, wherein the substrate is alternatingly and sequentially exposed to pulses of at least two gaseous reactants in about 1–20 cycles, and wherein the first temperature is chosen to prevent condensation of either of the reactants and to prevent substantial thermal decomposition of each of the reactants individually;

subjecting the substrate within the reaction chamber to a second treatment comprising chemical vapor deposition to deposit a bulk material on said nucleation film; and removing the substrate from the reaction chamber after the subjecting the substrate to the second treatment.

2. The method of claim 1 wherein the second treatment is conducted at a second temperature different from the first temperature.

3. The method of claim 2 wherein the second temperature is higher than the first temperature.

4. The method according to claim 1, wherein the nucleation film deposited by the first treatment is of a different composition from the bulk material deposited by the second treatment.

5. A method for chemical vapor deposition of a film onto a substrate, comprising:

inserting a substrate in a reaction chamber, subjecting said substrate to a first treatment comprising a nucleation treatment at a first temperature, followed by a second treatment comprising bulk chemical vapor deposition in the chamber; and removing said substrate from the reaction chamber after the second treatment wherein said nucleation treatment comprises atomic layer deposition, wherein the substrate is alternatingly and sequentially exposed to pulses of at least two mutually reactive gaseous reactants, wherein each pulse occurs during a treatment cycle, wherein the nucleation treatment includes between one and twenty treatment cycles, and wherein said first temperature is chosen to prevent condensation of either of said reactants and to prevent substantial thermal decomposition of each of said reactants individually, a material deposited by said first treatment has substantially the same composition as a material deposited by said second treatment, and said nucleation treatment comprises the deposition of alumina.

6. A method for chemical vapor deposition of a film onto a substrate, comprising:

inserting a substrate in a reaction chamber, subjecting said substrate to a first treatment comprising a nucleation treatment at a first temperature, followed by a second treatment comprising bulk chemical vapor deposition in the chamber; and removing said substrate from the reaction chamber after the second treatment wherein said nucleation treatment comprises atomic layer deposition, wherein the substrate is alternatingly and sequentially exposed to pulses of at least two mutually reactive gaseous reactants, wherein each pulse occurs during a treatment cycle, wherein the nucleation treatment includes between one and twenty treatment cycles, and wherein said first temperature is chosen to prevent condensation of either of said reactants and to prevent substantial thermal decomposition of each of said reactants individually, a material deposited by said first treatment has substantially the same composition as a material deposited by said second treatment, and said nucleation treatment comprises the deposition of zirconia.

7. A method for chemical vapor deposition of a film onto a substrate, comprising:

inserting a substrate in a reaction chamber, subjecting said substrate to a first treatment comprising a nucleation treatment at a first temperature, followed by a second treatment comprising bulk chemical vapor deposition in the chamber; and removing said substrate from the reaction chamber after the second treatment wherein said nucleation treatment comprises atomic layer deposition, wherein the substrate is alternatingly and sequentially expose to pulses of at least two mutually reactive gaseous reactants, wherein each pulse occurs during a treatment cycle, wherein the nucleation treatment includes between one and twenty treatment cycles, and wherein said first temperature is chosen to prevent condensation of either of said reactants and to prevent substantial thermal decomposition of each of said reactants individually, a material deposited by said first treatment has substantially the same composition as a material deposited by said second treatment, and said bulk chemical vapor deposition comprises deposition of a tantalum oxide layer.

8. The method according to claim 7, wherein a chemical vapor deposition source reactant for tantalum oxide comprises tantalum pentaethoxide [Ta—(O—C2H5)5] or tantalum tetraethoxide dimethylaminoethoxide [Ta(OC2H5)4 (OCH2CH2N(CH3)2)].

9. A method for chemical vapor deposition of a film onto a substrate, comprising:

inserting a substrate in a reaction chamber, subjecting said substrate to a first treatment comprising a nucleation treatment at a first temperature, followed by a second treatment comprising bulk chemical vapor deposition in the chamber; and removing said substrate from the reaction chamber after the second treatment wherein said nucleation treatment comprises atomic layer deposition, wherein the substrate is alternatingly and sequentially exposed to pulses of at least two mutually reactive gaseous reactants, wherein each pulse occurs during a treatment cycle, wherein the nucleation treatment includes between one and twenty treatment cycles, and wherein said first temperature, is chosen to prevent condensation of either of said reactants and to prevent substantial thermal decomposition of each of said reactants individually, a material deposited by said first treatment has substantially the same composition as a material deposited by said second treatment, and said bulk chemical vapor deposition comprises deposition of a metal oxide layer.

* * * * *